US006842325B2

(12) United States Patent
Meehleder et al.

(10) Patent No.: US 6,842,325 B2
(45) Date of Patent: Jan. 11, 2005

(54) FLEXIBLE CIRCUIT ADHERED TO METAL FRAME OF DEVICE

(75) Inventors: Steven M. Meehleder, Cedar Rapids, IA (US); Brian Grattan, Cedar Rapids, IA (US)

(73) Assignee: Square D Company, Palatine, IL (US)

( * ) Notice: Subject to any disclaimer, the term of this patent is extended or adjusted under 35 U.S.C. 154(b) by 186 days.

(21) Appl. No.: 09/955,660

(22) Filed: Sep. 19, 2001

(65) Prior Publication Data

US 2003/0053279 A1 Mar. 20, 2003

(51) Int. Cl.[7] .............................................. H01H 47/00
(52) U.S. Cl. ...................................... 361/160; 361/161
(58) Field of Search ................................. 361/160, 161, 361/165, 749, 776; 439/79, 67

(56) References Cited

U.S. PATENT DOCUMENTS

| | | | |
|---|---|---|---|
| 4,431,877 A | 2/1984 | Heft et al. | 200/144 |
| 4,635,011 A | 1/1987 | Leone et al. | 335/16 |
| 4,644,307 A | 2/1987 | Tanimoto | 335/16 |
| 4,684,183 A * | 8/1987 | Kinoshita et al. | 439/77 |
| 4,716,265 A | 12/1987 | Fujii et al. | 200/144 |
| 4,791,393 A | 12/1988 | Flick et al. | 335/16 |
| 4,841,266 A | 6/1989 | Wulff | 335/16 |
| 5,220,488 A | 6/1993 | Denes | 361/398 |
| 5,440,284 A | 8/1995 | Ferullo et al. | 355/202 |
| 5,528,093 A * | 6/1996 | Adam et al. | 310/89 |
| 5,707,249 A * | 1/1998 | Byrd | 439/500 |
| 5,793,270 A | 8/1998 | Beck et al. | 335/16 |
| 5,834,934 A * | 11/1998 | Baurand et al. | 324/127 |
| 5,837,950 A * | 11/1998 | Horikawa | 200/50.21 |
| 5,910,760 A | 6/1999 | Malingowski et al. | 335/167 |
| 5,926,081 A | 7/1999 | DiMarco et al. | 335/16 |
| 5,947,753 A * | 9/1999 | Chapman | 439/79 |
| 6,341,066 B1 * | 1/2002 | Murowaki et al. | 361/707 |

FOREIGN PATENT DOCUMENTS

| | | | | |
|---|---|---|---|---|
| DE | 2128633 | | 4/1973 | H01H/77/10 |
| DE | 4404706 A1 | | 9/1994 | H01H/77/10 |
| EP | 0772195 A2 | | 11/1996 | G11B/21/12 |
| JP | 04-280026 | | 10/1992 | H01H/71/12 |
| JP | 09-161641 | | 6/1997 | H01H/73/02 |
| JP | 2000-003655 | | 1/2000 | H01H/71/74 |
| WO | WO 01/16986 A1 | | 3/2001 | H01H/71/50 |

OTHER PUBLICATIONS

Description of Terasaki Circuit Breaker—Te21–43, as early as 1995, 1 page.
Description of Fuji Circuit Breaker—F–9–11, as early as 1995, 2 pages.

(List continued on next page.)

*Primary Examiner*—Michael Sherry
*Assistant Examiner*—Lawrence Luk

(57) ABSTRACT

An electrical device having a heat conductive housing has a flexible circuit board attached to the surface of the housing to control or take readings from the electrical. The flexible circuit board preferably has an adhesive coating on at least a portion of one side for adhering the flexible circuit board to the surface of the metal housing. At least one component mounted on the flexible circuit breaker generates heat, which is dissipated via the conductive housing. This arrangement provides a compact design that reduces the overall size of the electrical device and its associated circuitry, and also avoids the problem of dielectric separation between the electronic components and the heat sink. The electrical device may be a solenoid, a motor, a position detector, or a relay.

20 Claims, 3 Drawing Sheets

OTHER PUBLICATIONS

Description of Mitsubishi Circuit Breaker—M–21–6, as early as 1995, 2 pages.
Description of Toshiba Circuit Breaker—T–9–2, as early as 1995, 1 page.
Patent Abstract for Germany—DE 4404706 A, 1 page. (see B03).
Patent Abstracts for Japan—Publ. No. 04–280026, Oct. 6, 1992, 1 page. (see B04).
Patent Abstracts for Japan—Publ. No. 2000–003655, Jan. 7, 2000, 1 page. (see B06).
Patent Abstract for Japan—JP 9161641 A, 1 page. (see B05).
Photographs of Terasaki Circuit Breaker—Te21–43, Photographs 1–11, 11 pages.
Photographs of Fuji Circuit Breaker—F–9–11, Photographs 12–29, 18 pages.
Photographs of Mitsubishi Circuit Breaker—M–21–6, Photographs 30–48, 19 pages.
Photographs of Toshiba Circuit Breaker—T–9–2, Photographs 49–61, 13 pages.

* cited by examiner 250,309 B2

FLEXIBLE CIRCUIT ADHERED TO METAL FRAME OF DEVICE

FIELD OF THE INVENTION

The present invention relates generally to electrical circuit breakers, and, more specifically, to the assembly of electrical devices used in a circuit breaker by using flexible circuit boards.

BACKGROUND OF THE INVENTION

Electrical circuit breakers typically include devices such as actuators or a solenoids for effecting the movement of certain components in response to signals from one or more control circuits. These control circuits are typically mounted on rigid circuit boards that are mounted directly beside the devices being controlled, and are connected to those devices by wires. This arrangement can create problems when space becomes critical because space must be provided not only for the mounting of the circuit board but also to allow for the installation of the board and the wires that connect it to the device it is controlling. Accordingly, from this perspective the design of circuit breakers has met a design barrier when the object is to make a circuit breaker that is both small and economical.

SUMMARY OF THE INVENTION

A principal object of the present invention to allow the placement of electronic components that are used to control a particular electrical device in an electrical circuit breaker, such as an actuator or a solenoid, directly onto the housing of that device without requiring a significant amount of additional space.

Another object of the invention is to provide a more efficient heat dissipation environment for dissipating heat generated by the control circuitry, without having to add extra components such as, for example, a cooling fan. A related object is to reduce the dielectric separation between the electronic components and a heat sink.

In accordance with the present invention, the foregoing objectives are realized by a circuit breaker that comprises a controllable electrical device that includes a housing formed of heat conductive material, and a flexible circuit board which is fastened directly to at least a portion of the housing. The flexible circuit board has a circuit printed on it, and at least one heat-generating electronic component is mounted on the flexible circuit board. Heat generated by the electrical component is transferred to the metal housing which functions as a heat sink from which heat is naturally dissipated to the surroundings. The flexible circuit board can be adhered to any portion of any surface of the housing, according to the design requirements, and connected directly to the device being controlled.

In one embodiment, the electrical apparatus is an electro-mechanical device. Furthermore, the combination of the flexible circuit board and at least one electrical component can comprise a control system for the electro-mechanical device, or a system that sends a control signal in response to a signal received from the electro-mechanical device, or it can transmit processed signals to a location outside the electrical device.

In other embodiments the electro-mechanical device is a circuit breaker, a motor, a relay, a rheostat, a solenoid, an actuator, or a position sensor. For example, the invention can be applied to control an under voltage release solenoid, to control a motor, to take readings from a position detector, to control any general solenoid, or to take readings from a temperature sensor that is on a pipe.

BRIEF DESCRIPTION OF THE DRAWINGS

In the drawings:

FIG. 1b is a top plan view of the under voltage release shown in FIG. 3a;

FIG. 1c is a front elevation view of the under voltage release shown in FIG. 3a;

FIG. 2b is a side elevation view of the flexible circuit board shown in FIG. 2a;

FIG. 2c is a bottom plan view of the flexible circuit board shown in FIG. 2a;

FIG. 3b is a top plan view of the metal C-frame shown in FIG. 3a; and

FIG. 3c is a front elevation view of the metal C-frame shown in FIG. 3a.

DETAILED DESCRIPTION OF THE ILLUSTRATED EMBODIMENTS

Figure 1A:
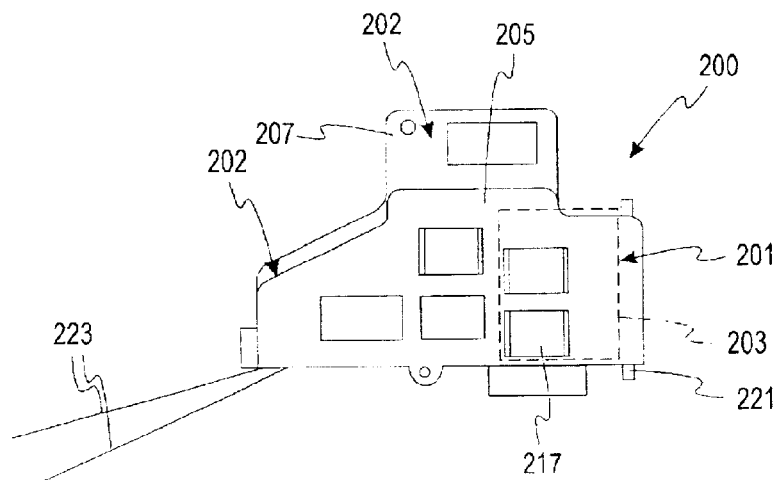
FIG. 1a is a side elevation view of an under voltage release embodying the invention.
Figure 1B:
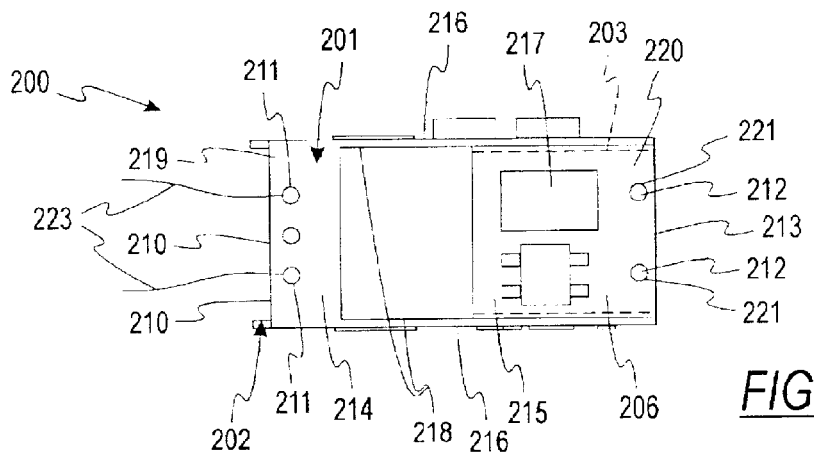
Figure 1C:
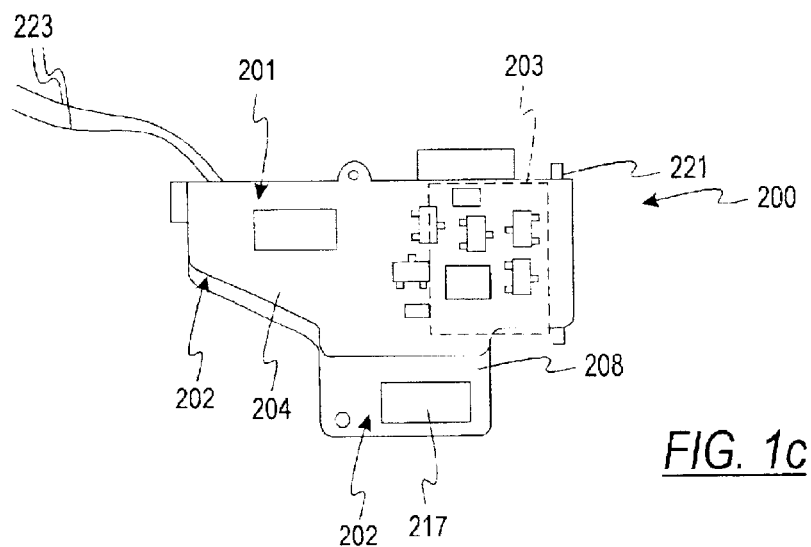
Figure 2A:
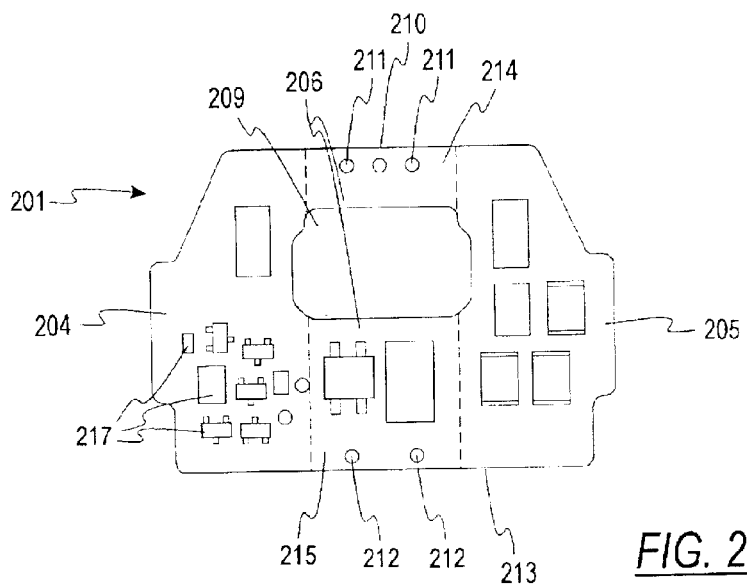
FIG. 2a is a top plan view showing the exterior surface of the flexible circuit board included in the under voltage release shown in shown in FIGS. 1a–1c.
Figure 2B:
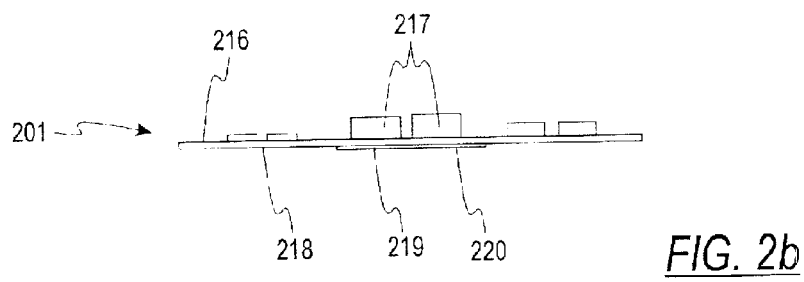
Figure 2C:
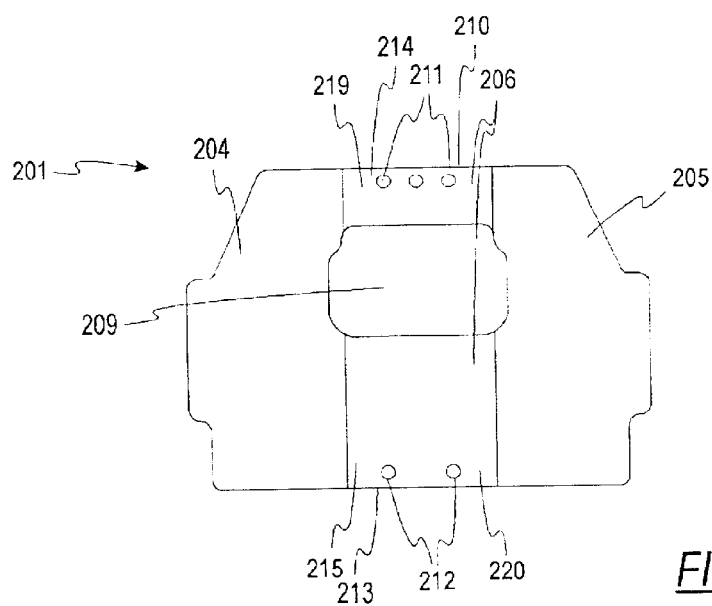
Figure 3A:
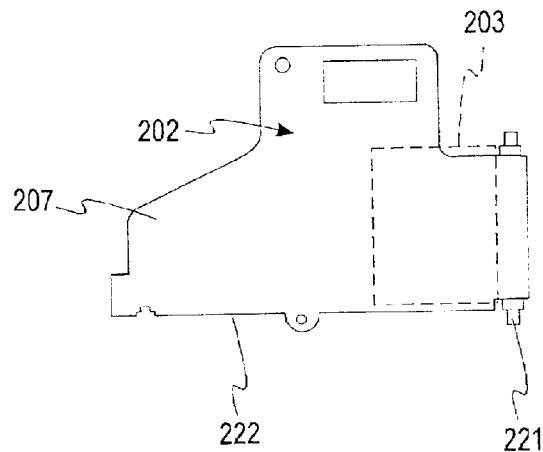
FIG. 3a is a rear elevation view of the metal C-frame included in the under voltage release shown in FIGS. 1a–1c.
Figure 3B:
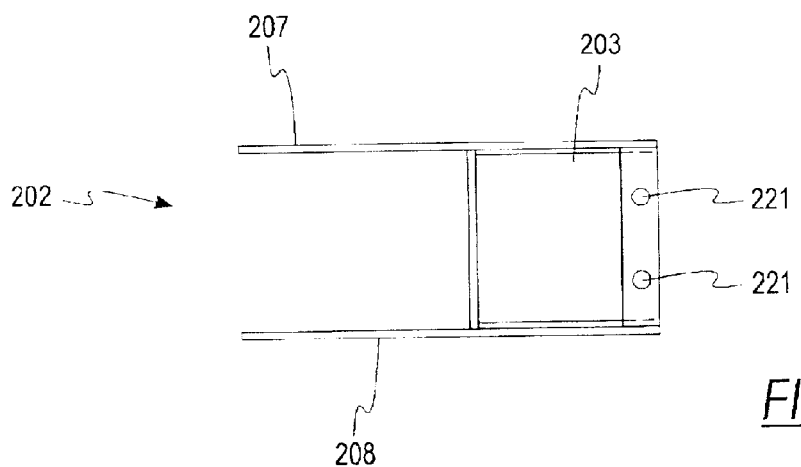
Figure 3C:
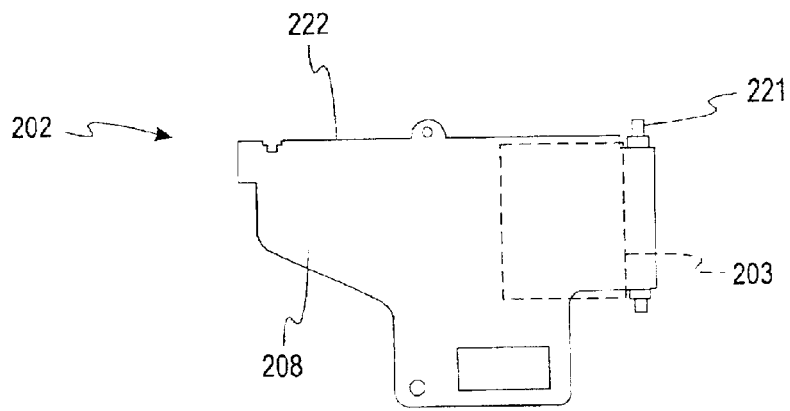

Referring now to the drawings, an under voltage release 200 comprises a flexible circuit board 201, a metal C-frame 202, and a solenoid 203. The flexible circuit board 201 has a first end section 204 and a second end section 205 that are mirror images of each other, being connected to each other by a joining section 206 (see FIG. 2c). The first end section 204 has a generally rectangular shape that approximately resembles the shape of a first frame surface 207 (see FIG. 3a). Similarly, the second end section 205 has a generally rectangular shape that approximately resembles the shape of a second frame surface 208 (see FIG. 3c).

The joining section 206 is rectangularly shaped, having a rectangular aperture 209 positioned near a lead wire end 210, two lead wire holes 211 positioned near the lead wire end 210, and two solenoid holes 212 positioned near a solenoid end 213. A small bridge part 214 forms the part of the joining surface 206 that is towards the lead wire end 210 and a big bridge part 215 forms the part of the joining surface 206 that is towards the solenoid end 213.

Furthermore, the flexible circuit board 201 has an exterior surface 216, on which a plurality of electronic components 217 are mounted, and an interior surface 218. The interior surface 218 of the first end surface 204 and of the second end surface 205 is different than the interior surface 218 of the joining surface 206. Although the flexible circuit board 201 is generally made of several layers of polyimide, adhesive, and RA copper that are sandwiched together having an adhesive backing as the last layer on the interior surface 218, the interior surface 218 of the joining surface 206 has in addition a stiffener material to reinforce the joining surface 206 because the joining surface 206 does not have a corresponding mating surface to C-frame 202. Specifically, a small stiffener 219 and a big stiffener 220 are attached to the interior surface 218 of the joining surface 206. The small stiffener 219 has a rectangular shape that is identical to the small bridge part 214, including matching holes for the lead wire holes 211. Similarly, the big stiffener 220 has a rectangular shape that is identical to the big bridge part 215, including matching holes for the solenoid holes 212.

Mounting the flexible circuit board 201 to the C-frame 202 requires that the joining surface 208 be placed over the C-frame 202 by having a pair of solenoid pins 221, which are located next to the solenoid 203, protrude through the solenoid holes 212, and that the joining surface 208 is positioned in such a way that it mates with a board side 222, which is located approximately next to the solenoid pins 221 The flexible circuit board 201 is then secured to the C-frame 202 by soldering the solenoid pins 221 to the flexible circuit board 201 near the solenoid holes 212. This provides a direct connection between the flexible circuit board 201 and the solenoid 203, rather than an indirect connection through means such as wires, that saves space and allows the design of a smaller circuit breaker. Also, the lead wires 223 are secured to the flexible circuit board 201 by soldering the lead wires 223 to the flexible circuit board 201 near the lead wire holes 211.

Next, the first end surface 204 is wrapped around the C-frame 202 by mating the first end surface 204 to the first frame surface 207 and having the adhesive backing found on the interior surface 218 of the first end surface 204 adhere to the first frame surface 207. Similarly, the second end surface 205 is wrapped around the C-frame 202 by mating the second end surface 205 to the second frame surface 208 and having the adhesive backing found on the interior surface 218 of the second end surface 205 adhere to the second frame surface 208 Adhering the flexible circuit board 201 directly onto the C-frame 202 eliminates dielectric separation between the electronic components 217 and the C-frame 202. Additionally, because the C-frame 202 acts as a heat sink, the adhering of the flexible circuit board 201 onto the C-frame 202 allows improved dissipation of heat generated by the electronic components 217.

The end result is that the flexible circuit board 201 is permanently mounted on the C-frame 202 and is directly connected to the solenoid 203 through the solenoid pins 221, constituting the under voltage release 200.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. An electrical device comprising:
   a housing formed of heat conductive material;
   an electrical apparatus positioned within said housing, said housing paritially enclosing said electrical apparatus; and
   a flexible printed circuit board attached directly to an exterior surface of said housing, said board having a circuit printed thereon, and further having at least one heat-generating electrical component mounted on an outside surface of said board,
   whereby heat generated upon operation of said electrical component is transferred to said housing and dissipated therefrom into the surroundings.

2. An electrical device in accordance with claim 1 in which said housing has a plurality of exterior surfaces and in which said flexible circuit board is adhered to at least some of said plurality of exterior surfaces.

3. An electrical device in accordance with claim 1 in which said electrical apparatus is an electro-mechanical device.

4. An electrical device in accordance with claim 3 in which said printed circuit and said at least one electrical component comprise a control system for said electro-mechanical device.

5. An electrical device in accordance with claim 3 in which said electro-mechanical device is a circuit breaker.

6. An electrical device in accordance with claim 3 in which said electro-mechanical device is a motor.

7. An electrical device in accordance with claim 3 in which said electro-mechanical device is a relay.

8. An electrical device in accordance with claim 3 in which said electro-mechanical device is a rheostat.

9. An electrical device in accordance with claim 3 in which said electro-mechanical device is a solenoid.

10. An electrical device in accordance with claim 3 in which said electro-mechanical device is an actuator.

11. An electrical device in accordance with claim 3 in which said electro-mechanical device is a position sensor.

12. An electrical device in accordance with claim 3 in which said printed circuit and said at least one electrical component comprises a system for receiving and processing signals from said electro-mechanical device.

13. An electrical device in accordance with claim 12, in which said partial circuit and said at least one electrical component further comprise a system for sending a control signal to said electro-mechanical device in response to a signal received from said electro-mechanical device.

14. An electrical device in accordance with claim 12, in which said printed circuit and said at least one electrical component further comprise means for transmitting processed signals to a location outside said electrical device.

15. A method for constructing an electrical device comprising:
    providing a housing formed of heat conductive material;
    providing an electrical apparatus within said housing, said housing partially enclosing said electrical apparatus; and
    attaching a flexible printed circuit board directly to an exterior surface of said housing, said board having a circuit printed thereon, and further having at least one heat-generating electrical component mounted on an outside surface of said board,
    whereby heat generated upon operation of said electrical component is transferred to said housing and dissipated therefrom into the surroundings.

16. A method in accordance with claim 15 in which said housing has a plurality of exterior surfaces and further comprising adhering said flexible circuit board to at least some of said plurality of exterior surfaces.

17. An electrical device comprising:
    a housing formed of heat conductive material;
    an electro-mechanical device positioned within said housing, said housing partially enclosing said electro-mechanical device, said electro-mechanical device including one of a motor, a relay, a rheostat, a solenoid, an actuator, and a position sensor; and
    a flexible printed circuit board directly attached to an exterior surface of said housing, said board having a circuit printed thereon, and further having at least one heat-generating electrical component mounted on an outside surface of said board, whereby heat generated upon operation of said electrical component is transferred to said housing and dissipated therefrom into the surroundings.

18. An electrical device in accordance with claim 17 in which said printed circuit and said at least one electrical component comprises a system for receiving and processing signals from said electro-mechanical device.

19. An electrical device in accordance with claim 18, in which said partial circuit and said at least one electrical component further comprise a system for sending a control signal to said electro-mechanical device in response to a signal received from said electro-mechanical device.

20. An electrical device in accordance with claim 18, in which said printed circuit and said at least one electrical component further comprise means for transmitting processed signals to a location outside said electrical device.

* * * * *